United States Patent
Jeong et al.

(10) Patent No.: US 8,048,229 B2
(45) Date of Patent: *Nov. 1, 2011

(54) APPARATUS FOR DEPOSITING AN ORGANIC LAYER AND METHOD FOR CONTROLLING A HEATING UNIT THEREOF

(75) Inventors: Min Jae Jeong, Yongin (KR); Do Geun Kim, Yongin (KR); Seok Heon Jeong, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 604 days.

This patent is subject to a terminal disclaimer.

(21) Appl. No.: 11/515,364

(22) Filed: Aug. 31, 2006

(65) Prior Publication Data

US 2007/0077358 A1    Apr. 5, 2007

(30) Foreign Application Priority Data

Aug. 31, 2005   (KR) ........................ 10-2005-0080997

(51) Int. Cl.
   *C23C 16/00*   (2006.01)
   *G05F 1/00*    (2006.01)
(52) U.S. Cl. ........................................ 118/726; 323/280
(58) Field of Classification Search .................... 118/726
   See application file for complete search history.

(56) References Cited

U.S. PATENT DOCUMENTS

| | | | |
|---|---|---|---|
| 2,440,135 A | 4/1948 | Alexander | |
| 3,081,425 A * | 3/1963 | Newbold | 323/280 |
| 4,543,467 A | 9/1985 | Eisele et al. | |
| 4,550,411 A * | 10/1985 | Stonestreet et al. | 373/134 |
| 4,845,956 A | 7/1989 | Berntsen et al. | |
| 5,803,976 A | 9/1998 | Baxter et al. | |
| 5,827,371 A * | 10/1998 | Colombo et al. | 118/726 |
| 5,902,634 A | 5/1999 | Maschwitz et al. | |
| 6,101,316 A * | 8/2000 | Nagashima et al. | 392/388 |
| 6,296,956 B1 | 10/2001 | Hunter | |
| 6,534,133 B1 * | 3/2003 | Kaloyeros et al. | 427/576 |
| 6,562,140 B1 | 5/2003 | Bondestam et al. | |
| 2002/0148402 A1 | 10/2002 | Kou et al. | |
| 2003/0015140 A1 * | 1/2003 | Van Slyke et al. | 118/723 VE |

(Continued)

FOREIGN PATENT DOCUMENTS

CN    1320172    10/2001

(Continued)

OTHER PUBLICATIONS

English translation of DE 4439519, Runday, Jun. 1996.*

(Continued)

*Primary Examiner* — Keath Chen
(74) *Attorney, Agent, or Firm* — Christie, Parker & Hale, LLP

(57) ABSTRACT

An apparatus for depositing an organic layer and a method for controlling the heating unit thereof are provided. The apparatus includes a crucible positioned in a deposition chamber and containing materials for evaporation. The apparatus also includes a heating unit having first and second heat sources for heating the crucible. A housing isolates the heat emitted from the heating unit and an outer wall anchors the crucible. A nozzle sprays the materials evaporated from the crucible. The first and second heat sources are positioned on first and second sides of the crucible, respectively, and are independently controlled to minimize the time required to stabilize the deposition rate.

7 Claims, 1 Drawing Sheet

U.S. PATENT DOCUMENTS

| | | |
|---|---|---|
| 2004/0163600 A1 | 8/2004 | Hoffmann et al. |
| 2005/0011448 A1 | 1/2005 | Iwata |
| 2005/0051096 A1 | 3/2005 | Horsky et al. |

FOREIGN PATENT DOCUMENTS

| | | | |
|---|---|---|---|
| CN | 1550569 | | 12/2004 |
| CN | 1555089 A | | 12/2004 |
| CN | 1626698 A | | 6/2005 |
| DE | 4439519 | * | 4/1996 |
| JP | 61-009574 | | 1/1986 |
| JP | 61-220414 | | 9/1986 |
| JP | 01-159369 | | 6/1989 |
| JP | 03-007883 | | 1/1991 |
| JP | 5-78826 | | 3/1993 |
| JP | 6-299336 | | 10/1994 |
| JP | 07-300666 | | 11/1995 |
| JP | 08-092733 | | 4/1996 |
| JP | 09-111441 | | 4/1997 |
| JP | 11-323552 | | 11/1999 |
| JP | 2000-012218 | | 1/2000 |
| JP | 2000 504645 | | 4/2000 |
| JP | 2000-160328 | | 6/2000 |
| JP | 3-608415 | | 10/2004 |
| JP | 2005-015869 | | 1/2005 |
| KR | 2002-0000356 | | 1/2002 |
| KR | 2002-0086761 | | 11/2002 |
| KR | 2003-0038268 | | 5/2003 |
| KR | 10-2004-0081264 | | 9/2004 |
| TW | 200710241 | | 3/2007 |
| TW | 200714725 | | 4/2007 |

OTHER PUBLICATIONS

SIPO Office action dated Oct. 24, 2008 for corresponding China application 200610112373.3 with English translation, indicating relevance of references listed in the IDS.
Patent Abstracts of Japan Publication No. 61-220414 dated Sep. 30, 1986, Fujii Toshio, 1 pg.
TIPO Examination Report dated Dec. 17, 2008 for corresponding Taiwan application 095131097 with English translation, indicating relevance of references listed in this IDS.
Patent Abstracts of Japan, Publication 05-078826, Published Mar. 30, 1993, in the name of Imafuku, et al.
Patent Abstracts of Japan, Publication 06-299336, Published Oct. 25, 1994, in the name of Kikuchi, et al.
Korean Patent Abstracts, Publication 1020040081264, Published Sep. 21, 2004, in the name of Kim, et al.
SIPO Office action dated Oct. 24, 2008 for Chinese Application 2006101277093, with English translation, noting listed Chinese references in this IDS.
TIPO Examination Report dated Jan. 22, 2009 for Taiwanese Application 095131101, noting listed U.S. reference in this IDS, namely, U.S. Patent 4,845,956.
TIPO Examination Report dated Dec. 18, 2008 for Taiwanese Application 095131093, noting listed references in this IDS, namely, U.S. Publication 2004/0163600 and TW 200710241.
U.S. Office action dated Apr. 15, 2009, for related U.S. Appl. No. 11/515,388, noting listed U.S. references in this IDS, namely, U.S. Publication 2005/0051096, 2002/0148402, and U.S. Patents 4,543,467 and 6,296,956.
Patent Abstracts of Japan, Application No. 11-016546; Filed Jan. 26, 1999 in the name of Oshima et al.
Patent Abstracts of Japan, Publication No. 11-323552; dated Nov. 26, 1999, in the name of Azuma et al.
Korean Patent Abstracts, Publication No. 1020020000356, dated Jan. 5, 2002, in the name of Geon Hui Kim et al.
Korean Patent Abstracts, Publication No. 1020020086761, dated Nov. 20, 2002, in the name of Cho et al.
Korean Patent Abstracts, Publication No. 1020030038268; dated May 16, 2003, in the name of Baek et al.
Japanese Office action dated May 19, 2009, for Japanese application 2006-113737, noting listed references in this IDS.
Japanese Office action dated Jul. 21, 2009, for corresponding Japanese application 2006-198618, noting listed reference in this IDS, as well as JP 61-220414, previously filed in an IDS dated Dec. 12, 2006, and JP 2000-160328 and JP 2000-012218 previously filed in an IDS dated Aug. 17, 2009.
U.S. Office action dated Sep. 2, 2009, for related U.S. Appl. No. 11/515,388, noting U.S. Patent listed in this IDS.
U.S. Office action dated Jun. 12, 2009, for related U.S. Appl. No. 11/514,318, noting listed U.S. reference in this IDS.
Chinese Office action dated Apr. 17, 2009, for corresponding Chinese application 200610112370.X, with English translation noting listed references in this IDS, as well as U.S. Publication 2003/0015140 cited in U.S. Office action dated May 27, 2009.
Japanese Office action dated Jul. 28, 2009, for Japanese application 2006-191897, noting listed Japan references in this IDS.
U.S. Office action dated Dec. 8, 2009, for related U.S. Appl. No. 11/515,388, noting listed reference in this IDS.
U.S. Office action dated Feb. 5, 2010, for related U.S. Appl. No. 11/514,318.
SIPO Office action dated Feb. 5, 2010, for corresponding Chinese Patent application 200610112373.3, with English translation, noting U.S. Patent 5,827,371 previously cited in U.S. Office action dated May 27, 2009.
Japanese Office action dated Mar. 16, 2010, for Korean Patent application 10-2005-0080998, noting listed references in this IDS.
Japanese Office action dated Apr. 20, 2010, for Korean Patent application 10-2005-0080996, noting listed references in this IDS.
U.S. Office action dated Jun. 15, 2010, for related U.S. Appl. No. 11/514,318 noting U.S. reference in this IDS, as well as U.S. Patent 4,550,411, previously cited in Office action dated Nov. 27, 2009.

* cited by examiner

APPARATUS FOR DEPOSITING AN ORGANIC LAYER AND METHOD FOR CONTROLLING A HEATING UNIT THEREOF

CROSS-REFERENCE TO RELATED APPLICATIONS

This application claims priority to and the benefit of Korean Patent Application No. 2005-80997, filed on Aug. 31, 2005, in the Korean Intellectual Property Office, the entire content of which is incorporated herein by reference.

FIELD OF THE INVENTION

The present invention relates to an apparatus for depositing an organic layer and to a method for controlling a heating source thereof. More specifically, the invention is directed to an apparatus for depositing an organic layer capable of improving deposition efficiency, preventing condensation of the nozzle, and controlling temperature by minimizing the time required to stabilize the deposition rate.

BACKGROUND OF THE INVENTION

Generally, a deposition apparatus is used to deposit thin films on various electronic parts. In particular, the deposition apparatus is used to form thin films on electronic devices and display devices such as semiconductors, LCDs, organic electroluminescence displays, etc.

Organic electroluminescence displays are electroluminescence displays that inject electrons and holes into emitting layers from electron injecting electrodes (Cathode) and hole injecting electrodes (Anode), respectively. Light is emitted when exitons, coupled with the injected electrons and holes, fall from excited states to ground states.

To improve light-emitting efficiency of the organic electroluminescence display, the holes and electrons are transported to an emitting layer. For this purpose, an electron transfer layer (ETL) may be positioned between the cathode and the organic light-emitting layer, and a hole transport layer may be positioned between the anode and the organic light-emitting layer.

Also, a hole injection layer (HIL) may be positioned between the anode and the hole transport layer, and an electron injection layer (EIL) may be positioned between the cathode and the electron transfer layer.

Generally, thin films are formed on substrates by physical vapor deposition such as vacuum evaporation, ion-plating and sputtering. However, thin films may also be formed by chemical vapor deposition or by gas reactions, etc.

Vacuum evaporation has been used to form thin films, such as metal films, for organic electroluminescence devices and the like.

Indirect heating systems (or induced heating systems) have been used in vacuum evaporation. In such systems, the deposition materials are contained in crucibles and indirect heating systems are used to heat the deposition materials to predetermined temperatures. The apparatuses also include heaters for heating the crucibles, and nozzles for spraying the deposition materials emitted from the heated crucibles onto substrates.

However, these indirect heating systems are expensive since linear metallic heating sources such as Ta, Mo and W are used, and the linear structure yields low heating efficiency.

Also, effective isolation of the heating unit remains a requirement since the heat emitted from the heating unit to heat the crucible is transferred to other regions of the apparatus.

In addition, to achieve the deposition rate required for heating the crucible, electric power is applied to the heating unit at an established reference deposition rate to elevate temperature. The heating unit is sustained at that reference deposition rate until the deposition rate is stabilized. Deposition is performed after stabilization of the deposition rate and during the time in which the deposition rate is stable. However, this deposition method requires excessive amounts of time to stabilize the deposition rate, increasing the amount of time needed for the deposition of materials on the substrate.

Also, the deposition materials evaporate due to irregular heat transfer to the crucible. These evaporated deposition materials condense on the nozzle while flowing toward the substrate, thereby decreasing deposition efficiency and reducing product yield.

SUMMARY OF THE INVENTION

In one embodiment of the present invention, an apparatus for depositing an organic layer improves heating efficiency using plate-type resistive heat sources. The deposition apparatus also improves deposition efficiency and temperature control by independently controlling the heating of upper and lower portions of the crucible containing the deposition materials, thereby minimizing the time required to stabilize the deposition rate.

In one embodiment, the deposition apparatus includes a crucible positioned in a deposition chamber. The crucible contains materials which will be evaporated during heating. The deposition apparatus further comprises a heating unit including first and second heating sources for applying heat to the crucible, a housing for isolating the heat emitted from the heating unit, an outer wall for anchoring the crucible, and a nozzle for spraying the materials evaporated from the crucible onto a substrate. The heating unit comprises a first heating source for heating the upper portion of the crucible, and a second heating source for heating the lower portion of the crucible. The heating unit further comprises a first power source for supplying electric power to the first heating source, and a second power source for supplying electric power to the second heating source.

The deposition apparatus may further include a controller for controlling the first and second power sources of the heating unit. The controller can control the first and second power sources independently.

In another embodiment, the controller includes a sensor unit for measuring the deposition rate of the organic materials evaporated from the crucible. The controller may further comprise a sensor unit for comparing the deposition rate of the organic materials to an established reference deposition rate.

The heating unit may comprise plate-type resistive heat sources, which can be selected from the group consisting of carbon composites, SiC, and graphite. The resistive heat sources have heating temperatures ranging from about 150° C. to about 500° C.

The deposition apparatus may further include at least one reflector between the outer wall and the housing. The reflector serves to prevent heat transfer from the heating source toward the outer wall. In one embodiment, the deposition apparatus comprises two reflectors or less.

In another embodiment of the present invention, a method for controlling the heating unit of the deposition apparatus includes controlling temperature by independently heating the first and second heat sources of the heating unit, which heats the crucible containing the deposition materials. The method further comprises controlling the deposition rate by fixing the electric power supplied to one of the first and second heat sources and adjusting the electric power supplied to the other heat source after the desired temperature is achieved.

After controlling the temperature, the deposition rate of the evaporated organic materials is measured and compared to an established reference deposition rate. The deposition rate is then be controlled once the measured deposition rate reaches 10 to 70% of the established reference deposition rate.

To control the deposition rate, the temperature of the second heat source is fixed and the temperature of the first heat source is adjusted. Here, the temperature of the second heat source is lower than the glass transition temperature ($T_g$) of the organic materials contained in the crucible, and the temperature of the first heat source is adjusted to control the deposition rate.

DETAILED DESCRIPTION OF PREFERRED EMBODIMENTS

Figure 1:
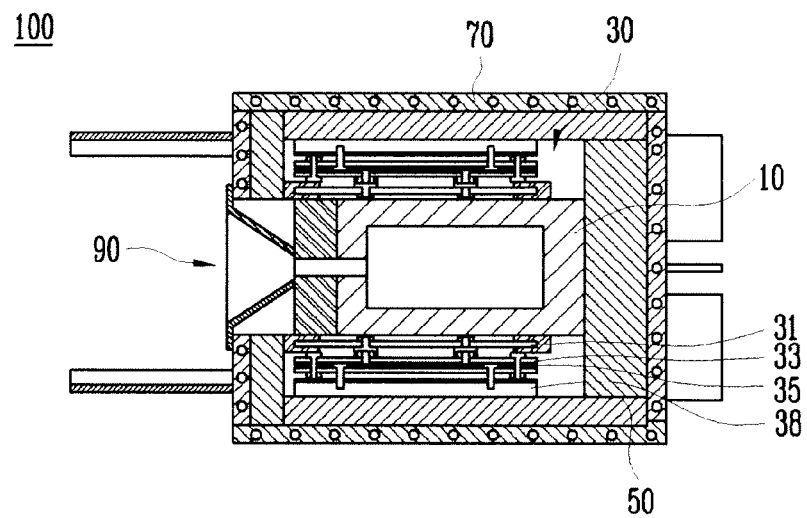
FIG. 1 is a cross-sectional view of a deposition apparatus according to one embodiment of the present invention.
Figure 2:
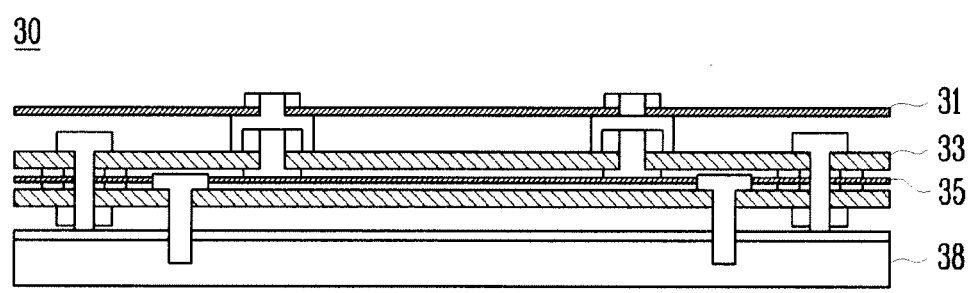
FIG. 2 is a schematic drawing of a heating unit of the deposition apparatus of FIG. 1.
Figure 3:
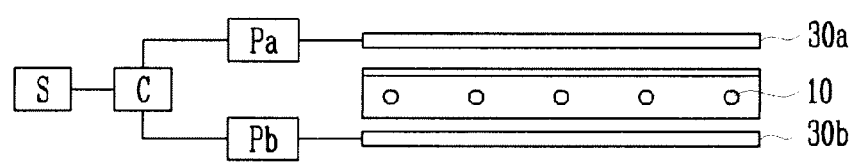
FIG. 3 is a schematic drawing of the deposition apparatus of FIG. 1.

FIG. 1 illustrates an apparatus for depositing an organic layer according to one embodiment of the present invention and FIG. 2 illustrates the heating unit used in the apparatus of FIG. 1. FIG. 3 schematically illustrates the structure of the apparatus of FIG. 1.

According to one embodiment of the present invention, the apparatus for depositing an organic layer 100 includes a crucible 10 positioned in a deposition chamber (not shown), the crucible containing deposition materials. The apparatus 100 also includes a heating unit 30 which comprises first and second heat sources 30a and 30b (shown in FIG. 3) for applying heat to the crucible 10. A housing 50 is provided for isolating the heat emitted from the heating unit 30. An outer wall 70 anchors the crucible 10, and a nozzle 90 sprays the materials evaporated from the crucible 10 onto a substrate (not shown). The heating unit 30 comprises a first heat source 30a positioned near the upper portion of the crucible 10, and a second heat source 30b positioned near the lower portion of the crucible 10. The heating unit 30 further includes a first power source Pa for supplying electric power to the first heat source 30a, and a second power source Pb for supplying electric power to the second heat source 30b.

The crucible 10 contains deposition materials, for example organic materials, and the first and second heat sources 30a and 30b, respectively, of the heating unit 30 are positioned around the crucible 10 to heat the crucible 10.

The housing 50 contains the crucible 10 and the heating unit and is positioned so that it can isolate the heat emitted from the heating unit 30.

The crucible 10, heating unit 30 and housing 50 are anchored in the outer wall 70, which makes up the boundaries of the deposition apparatus 100.

A nozzle 90 is positioned in one side of the outer wall 70 and serves to spay the deposition materials evaporated from the crucible 10 onto a substrate. The nozzle 90 extends from the side of the outer wall 70 through the housing 50.

The first heat source 30a is positioned near the upper portion of the crucible 10, and the second heat source 30b is positioned near the lower portion of the crucible 10. The heat sources 30a and 30b can include plate-type heaters 31, as shown in FIG. 2. The plate-type heaters 31 can be resistive heat sources. Nonlimiting examples of suitable resistive heat sources for use with the present invention include carbon composites, SiC and graphite. These materials are significantly less expensive than the conventional linear metallic heaters using Ta, Mo and W. Also, the plate-type heaters have improved heating ability.

Plate-type heaters 31 have larger planar areas than the crucible 10, enabling effective heat transfer to the crucible 10. The plate-type resistive heaters 31, have heating temperatures ranging from about 150° C. to about 500° C. to deposit organic materials.

Supports 33 and reflectors 35 are arranged between the outer wall 70 of the apparatus 100 and the heaters 31. The supports 33 are provided in pairs to support the reflectors 35, and to support the heaters 31 around the crucible 10.

The reflectors 35 serve to isolate the heat emitted from the heater 31 and prevent it from being directed toward the outer wall 70. Generally, the apparatus comprises two reflectors 35 or less, i.e. two reflectors each for the first and second heat sources 30a and 30b, respectively.

Heat insulating unit 38 are arranged opposite the supports 33 supporting the reflectors 35, i.e. the heat insulating unit are positioned between the outer wall 70 and the supports 33. However, these heat insulating unit 38 can be omitted, depending on the heating temperature and the heat-isolating efficiency of the reflectors 35.

The first heat source 30a is positioned near the upper portion of the crucible 10, and the second heat source 30b is positioned near the lower portion of the crucible 10. The first heat source 30a receives electric power from the first power source Pa, and the second heat source 30b receives electric power from the second power source Pb. The first and second power sources Pa and Pb, respectively, are connected to a controller C such that the controller can control each power source independently.

The controller C includes a sensor unit S for measuring the deposition rate of the organic materials emitted from the crucible 10. The sensor unit for measuring the deposition rate can be positioned near the substrate (not shown), which is generally positioned in front of the nozzle 90. The controller C may further include a sensor unit for comparing the measured deposition rate to the established reference deposition rate.

With this configuration, the supply of power to the first and second power sources Pa and Pb, respectively, may be controlled by comparing the measured deposition rate to the established reference deposition rate. After comparing the measured deposition rate to the reference rate, the power supplied to the first and second heating sources 30a and 30b may be adjusted accordingly.

In another embodiment of the present invention, a method for controlling the heating unit of an apparatus for depositing an organic layer includes controlling temperature by independently heating the first and second heat sources 30a and 30b, respectively. The first and second heat sources 30a and 30b supply heat to the crucible 10, which contains the organic materials to be deposited. The method further comprises controlling the deposition rate by fixing the electric power supplied to one of the first and second heat sources 30a and 30b, respectively, and adjusting the electric power supplied to the other heat source until the desired temperature is achieved.

The crucible 10 is heated to a temperature greater than the evaporation temperature of the organic materials contained in the crucible. The evaporation temperature of the organic materials is defined as the vapor pressure curve of the material measured in vacuum.

If the temperatures of the first and second heat sources 30a and 30b, respectively, are elevated at the same time (i.e. if the power applied to the first and second heat sources 30a and 30b, respectively, is gradually increased at the same time), the organic materials will evaporate after sufficient heat has been transferred to the crucible 10.

The method can further comprise measuring the deposition rate after the temperature has been controlled. The measured deposition rate can then be compared to an established reference deposition rate that is input into the controller C.

The elevated temperatures of the first and second heat sources 30a and 30b, respectively, which occur after the temperature has been controlled, are used to control the deposition rate when the measured deposition rate reaches 10 to 70% of the reference deposition rate. To control the deposition rate, the power supplied to one of the first and second heat sources 30a and 30b, respectively, is fixed, and the power supplied to the other of the first and second heat sources is adjusted accordingly.

The deposition rate is controlled by controlling the heat supplied to the crucible when the measured deposition rate reaches 10 to 70% of the reference deposition rate in order to reduce the time required to stabilize the deposition rate. Conventional methods stabilize the deposition rate when the measured deposition rate reaches 100% of the reference deposition rate, which requires significantly more time than the methods of the present invention. According to the present invention, the elevated temperatures imparted by thermal driving forces provide a faster deposition rate, enabling the desired deposition rate to be achieved more rapidly by controlling the deposition rate before it reaches 100% of the reference deposition rate. Accordingly, the cost of the organic materials, including the crucible 10, may be reduced.

The deposition apparatus is driven, and the deposition rate controlled, by fixing the temperature of the second heat source 30b and adjusting the temperature of the first heat source 30a in order to control the deposition rate.

The temperature of the second heat source 30b is fixed so that the organic materials in the crucible 10 will precipitate in the lower portion of the crucible 10. The organic materials may be denatured if heat is excessively supplied to the organic materials in the crucible 10.

Conventional organic materials are sensitive to temperature, and their physical properties can change when the reach their glass transition temperature $T_g$. Accordingly, the temperature of the second heat source 30b is lower than the glass transition temperature $T_g$ of the organic materials in the crucible 10.

The temperature of the first heat source 30a is adjusted to control the deposition rate of the organic materials. For example, the temperature of the first heat source 30a is adjusted to prevent the organic materials from condensing in cold temperatures as they flow toward the substrate. To prevent this from occurring, sufficient heat is transferred to the organic materials and the materials evaporate.

As described above, the apparatuses for depositing organic layers according to the present invention, and the methods for controlling the heating sources thereof, improve heating efficiency by using plate-type resistive heating sources. The apparatuses and methods also improve deposition efficiency by independently controlling the temperature of the upper and lower portions of the crucible, thereby minimizing the time required to stabilize the deposition rate.

Although certain exemplary embodiments of the present invention have been shown and described, it is appreciated by those skilled in the art that changes can be made to the described embodiments without departing from the principle, spirit and scope of the invention, as defined in the accompanying claims.

What is claimed is:

1. An apparatus for depositing an organic layer, the apparatus comprising:
a crucible positioned in a deposition chamber, the crucible being adapted to contain organic materials for evaporation,
a heating unit including first and second heat sources for applying heat to the crucible, wherein the first heat source is positioned near a first side of the crucible and the second heat source is positioned near a second side of the crucible, wherein a temperature of the second heat source is lower than the glass transition temperature of the organic materials in the crucible, the heating unit further comprising a first power source for supplying power to the first heat source, a second power source for supplying power to the second heat source, and a controller for independently controlling the first and second power sources, and for comparing a measured deposition rate to a reference deposition rate using a sensor unit, wherein the controller is configured to fix the power supplied to the second heat source and adjust the power supplied to the first heat source when the measured deposition rate reaches about 10% to about 70% of the reference deposition rate,
a first housing generally surrounding the heating unit and the crucible for isolating the heat emitted from the heating unit,
an outer housing generally surrounding the first housing, the outer housing configured to anchor the crucible, and
a nozzle for spraying the materials contained in the crucible onto a substrate.

2. The apparatus according to claim 1, wherein the first and second heat sources each comprise a plate-type resistive heating source.

3. The apparatus according to claim 2, wherein the plate-type resistive heating source is selected from the group consisting of carbon composites, SiC, and graphite.

4. The apparatus according to claim 2, wherein the plate-type resistive heating source has a heating temperature ranging from about 150° C. to about 500° C.

5. The apparatus according to claim 1, wherein each of the first and second heat sources comprises a heater and a reflector between the first housing and the heater, wherein the reflector prevents heat from transferring from the heaters to the outer wall.

6. The apparatus according to claim 1, wherein each of the first and second heat sources comprises 2 reflectors or less.

7. An apparatus for depositing an organic layer, the apparatus comprising:
a crucible positioned in a deposition chamber, the crucible being adapted to contain organic materials for evaporation,
a heating unit including first and second heat sources for applying heat to the crucible, wherein the first heat source is positioned near a first side of the crucible and the second heat source is positioned near a second side of the crucible, wherein a temperature of the second heat source is lower than the glass transition temperature of the organic materials in the crucible, the heating unit further comprising a first power source for supplying power to the first heat source, a second power source for supplying power to the second heat source, and a controller for independently controlling the first and second power sources, and for comparing a measured deposition rate to a reference deposition rate using a sensor unit, wherein the controller is configured to fix the power supplied to the second heat source and adjust the power supplied to the first heat source when the measured deposition rate reaches about 10% to about 70% of the reference deposition rate, a first housing generally surrounding the heating unit and crucible for isolating the heat emitted from the heating unit, an outer housing generally surrounding the first housing, the outer housing configured to anchor the crucible, and a nozzle for spraying the materials contained in the crucible onto a substrate.

* * * * *